(12) United States Patent
Kinoshita (10) Patent No.: US 11,700,717 B2
(45) Date of Patent: Jul. 11, 2023

(54) ELECTROMAGNETIC SHIELD MEMBER AND WIRE HARNESS

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventor: Hirohito Kinoshita, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 203 days.

(21) Appl. No.: 17/430,197

(22) PCT Filed: Nov. 27, 2019

(86) PCT No.: PCT/JP2019/046327
§ 371 (c)(1),
(2) Date: Aug. 11, 2021

(87) PCT Pub. No.: WO2020/170541
PCT Pub. Date: Aug. 27, 2020

(65) Prior Publication Data
US 2022/0167533 A1   May 26, 2022

(30) Foreign Application Priority Data

Feb. 22, 2019 (JP) ................. 2019-030439

(51) Int. Cl.
*H05K 9/00* (2006.01)
*H02G 3/04* (2006.01)

(52) U.S. Cl.
CPC ......... *H05K 9/0007* (2013.01); *H02G 3/0487* (2013.01)

(58) Field of Classification Search
None
See application file for complete search history.

(56) References Cited

U.S. PATENT DOCUMENTS 3,749,813 A * 7/1973 Shealy ............... H02G 7/14
174/42
7,521,817 B2 * 4/2009 Gors ............... B60R 21/017
337/415

(Continued)

FOREIGN PATENT DOCUMENTS

| JP | 2005-44607 A | 2/2005 |
| JP | 2011-192578 A | 9/2011 |
| JP | 2017-60206 A | 3/2017 |

OTHER PUBLICATIONS

Feb. 18, 2020 International Search Report issued in International Patent Application No. PCT/JP2019/046327.

*Primary Examiner* — Krystal Robinson
(74) *Attorney, Agent, or Firm* — Oliff PLC (57) ABSTRACT

An electromagnetic shield member that includes a pressing mechanism with: a cylinder provided on one of a bottom wall of the groove and an opposing wall of the cover opposing the bottom wall of the groove; a piston provided so as to be capable of reciprocal movement in the cylinder; a spring that is provided in the cylinder, and is configured to bias the piston toward one end of the cylinder; and a piston rod that is coupled to the piston, protrudes from the one end of the cylinder, and has a leading end configured to press the electrical wire.

5 Claims, 6 Drawing Sheets

(56) References Cited

U.S. PATENT DOCUMENTS

| | | | |
|---|---|---|---|
| 2005/0045357 A1* | 3/2005 | Ichikawa | H02G 3/0431 174/50 |
| 2005/0087358 A1* | 4/2005 | Santelli | H02G 3/0418 174/68.1 |
| 2009/0050350 A1* | 2/2009 | Katsumata | H02G 3/0468 174/72 A |
| 2013/0008710 A1 | 1/2013 | Toyama et al. | |
| 2017/0076837 A1 | 3/2017 | Yanazawa et al. | |
| 2020/0028337 A1* | 1/2020 | Hartman | H02G 3/0456 |
| 2022/0161742 A1* | 5/2022 | Saito | H01B 7/18 |

* cited by examiner

ELECTROMAGNETIC SHIELD MEMBER AND WIRE HARNESS

BACKGROUND

The present disclosure relates to an electromagnetic shield member and a wire harness.

Conventionally, for example, a wire harness applied to a vehicle such as an electric car is provided with a plurality of electrical wires and an electromagnetic shield member that has conductive properties and electromagnetically shields the electrical wires by individually covering the electrical wires (e.g., see JP 2005-44607A). The electromagnetic shield member disclosed in JP 2005-44607A includes a shielding protector that has groove-shaped housing portions in which electrical wires can be individually housed, and a cover that seals off the groove-shaped housing portions. The electrical wires are electromagnetically shielded due to the outer circumferential surfaces of the electrical wires being covered by the shielding protector and the cover.

SUMMARY

In a wire harness provided with a conventional electromagnetic shield member, including the electromagnetic shield member disclosed in JP 2005-44607A, heat is generated due to an electrical current flowing through the electrical wires. There is a concern of electrical wires floating from the inner surface of the electromagnetic shield member due to the electrical wires thermally expanding. The inventors of the present disclosure realized that, as a result, the contact surface area between the electrical wires and the electromagnetic shield member is reduced, the efficiency of heat conduction from the electrical wires to the electromagnetic shield member is reduced, and the dissipation of heat from the electrical wires via the electromagnetic shield member deteriorates.

An exemplary aspect of the disclosure provides an electromagnetic shield member and a wire harness that can suppress floating of electrical wires from an inner surface of the electromagnetic shield member.

An electromagnetic shield member according to an exemplary aspect includes: a case that includes a groove in which an electrical wire is to be individually housed; a cover configured to be attached to the case and cover the groove; and a pressing mechanism that is provided on one of the case and the cover, and is configured to press the electrical wire toward other of the case and the cover, wherein the pressing mechanism includes: a cylinder provided on one of a bottom wall of the groove and an opposing wall of the cover opposing the bottom wall of the groove; a piston provided so as to be capable of reciprocal movement in the cylinder; a spring that is provided in the cylinder, and is configured to bias the piston toward one end of the cylinder; and a piston rod that is coupled to the piston, protrudes from the one end of the cylinder, and has a leading end configured to press the electrical wire.

With this configuration, the leading end of the piston rod of the pressing mechanism provided on one of the case and the cover presses the electrical wire toward the other one of the case and the cover. Accordingly, floating of the electrical wire from the inner surface of the electromagnetic shield member can be suppressed.

Also, if a configuration is employed in which, for example, an electrical wire is pressed against a bottom wall or the like of a groove using a band member, there is a concern that the band member will bite into the electrical wire due to thermal expansion or vibration of the electrical wire.

In this respect, with the above configuration, displacement caused by thermal expansion or vibration of the electrical wire is absorbed by the spring. Accordingly, the above-described issues can be kept from occurring.

In several examples of the present disclosure, the pressing mechanism includes a grip that is provided at the leading end of the piston rod and is configured to grip the electrical wire, and the piston is configured to pivot in a circumferential direction centered around an axis of the cylinder, inside the cylinder.

With this configuration, the leading end of the piston rod is provided with the grip that grips the electrical wire. The piston to which the piston rod is coupled is provided so as to be able to pivot in the circumferential direction centered around the axis of the cylinder. Thus, the portion of the electrical wire sandwiched by the grip can pivot in the above circumferential direction. Accordingly, when excess length is generated in the electrical wire due to thermal expansion, due to the piston pivoting, the electrical wire can curve while remaining pressed against the bottom wall of the case or the opposing wall of the cover. Thus, even if excess length is generated in the electrical wire, floating of the electrical wire can be suppressed.

In several examples of the present disclosure, the electromagnetic shield member further includes a first protrusion and a second protrusion configured to respectively restrict rotation of the piston to one side and another side in the circumferential direction of the piston, wherein: the groove includes a plurality of grooves and the pressing mechanism includes a plurality of pressing mechanisms that are provided spaced apart from each other in an extending direction of the plurality of grooves of the case, and a first pressing mechanism out of two of the plurality of pressing mechanisms that are adjacent in the extending direction is provided in a state where rotation of the piston thereof to the one side is restricted by the first protrusion, and a second pressing mechanism out of the two of the plurality of pressing mechanisms is provided in a state where rotation of the piston thereof to the another side is restricted by the second protrusion.

With this configuration, the pistons of the two pressing mechanisms that are adjacent in the extending direction of each groove are only allowed to rotate in opposite directions. Thus, in the case where excess length is generated in an electrical wire due to thermal expansion, the portion of the electrical wire located between the two corresponding pressing mechanisms is unlikely to curve so as to bulge to the one side in the width direction of the grooves, and is more likely to curve to the other side in the width direction of the grooves.

Here, in the case where, for example, a heat source or the like is present on one side in the width direction of the electromagnetic shield member, curving of the electrical wires in the grooves toward the one side is not favorable as heat is more likely to be generated in the electrical wires.

Thus, if the two above-described pressing mechanisms are arranged such that the portion of the corresponding electrical wire located between the pressing mechanisms is made less likely to curve toward the above-described one side, the electrical wires in the groove portions can be kept from curving toward the heat source.

In several examples of the present disclosure, the grip is provided with a pair of arms, and the pair of arms are provided such that the distance between leading ends thereof can be changed.

With this configuration, the distance between the leading ends of the pair of arms constituting the grip can be changed. Thus, various types of electrical wires of varying sizes can be gripped.

Also, wire harness for achieving the aforementioned object, the wire harness including: the electrical wire; and the electromagnetic shield member, wherein the pressing mechanism is provided on one of the case and the cover, and presses the electrical wire toward the other of the case and the cover.

With this configuration, operations and effects similar to those of any one of the above-described electromagnetic shield members can be realized.

With the present disclosure, floating of electrical wires from an inner surface of the electromagnetic shield member can be suppressed.

BRIEF DESCRIPTION OF THE DRAWINGS

FIG. 9 is a cross-sectional view of a wire harness according to a second variation.

DETAILED DESCRIPTION OF EMBODIMENTS

An embodiment of an electromagnetic shield member and a wire harness will be described below with reference to FIGS. 1 to 7. Note that, in the accompanying drawings, some of the components may be exaggerated or simplified for the sake of convenience of description. The dimensional ratios of the components may also be different from the actual dimensional ratios thereof.

The wire harness according to the present embodiment is routed along a path including under the floor of a vehicle such as a hybrid car or electric vehicle, for example, and electrically connects devices to each other.

Figure 1:
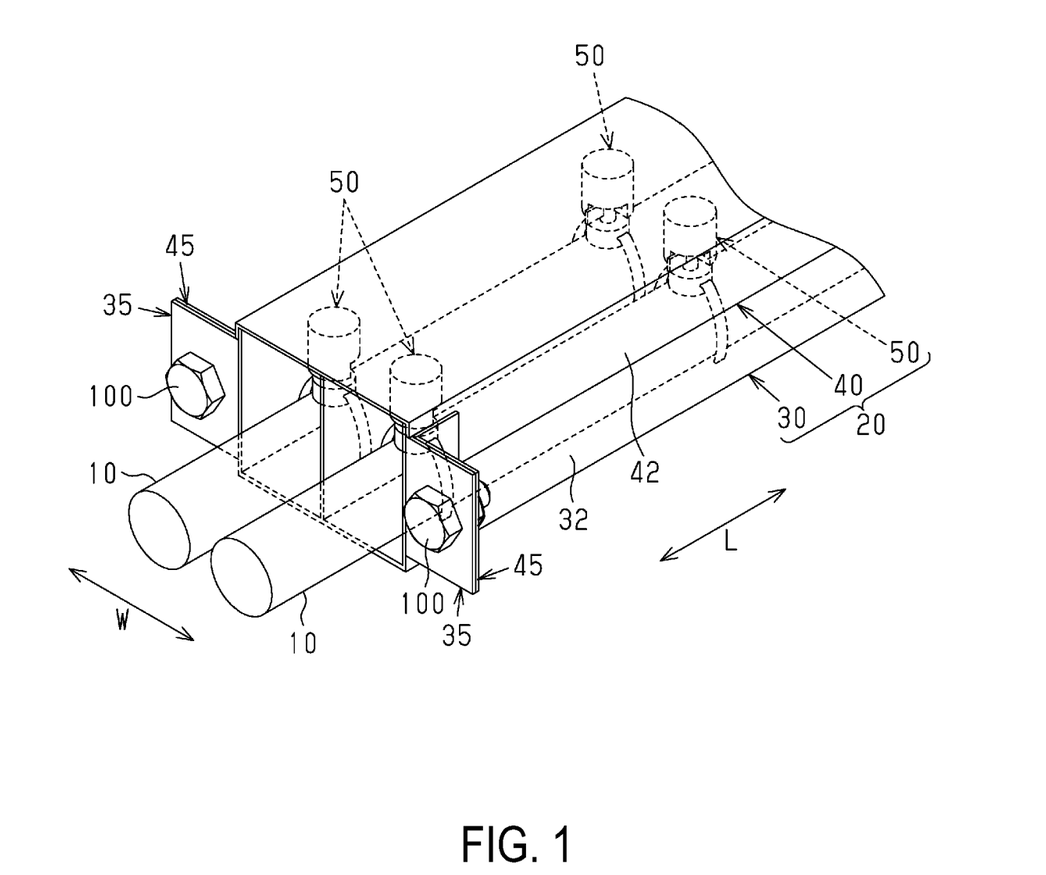
FIG. 1 is a perspective view of a portion of a wire harness according to an embodiment.
Figure 2:
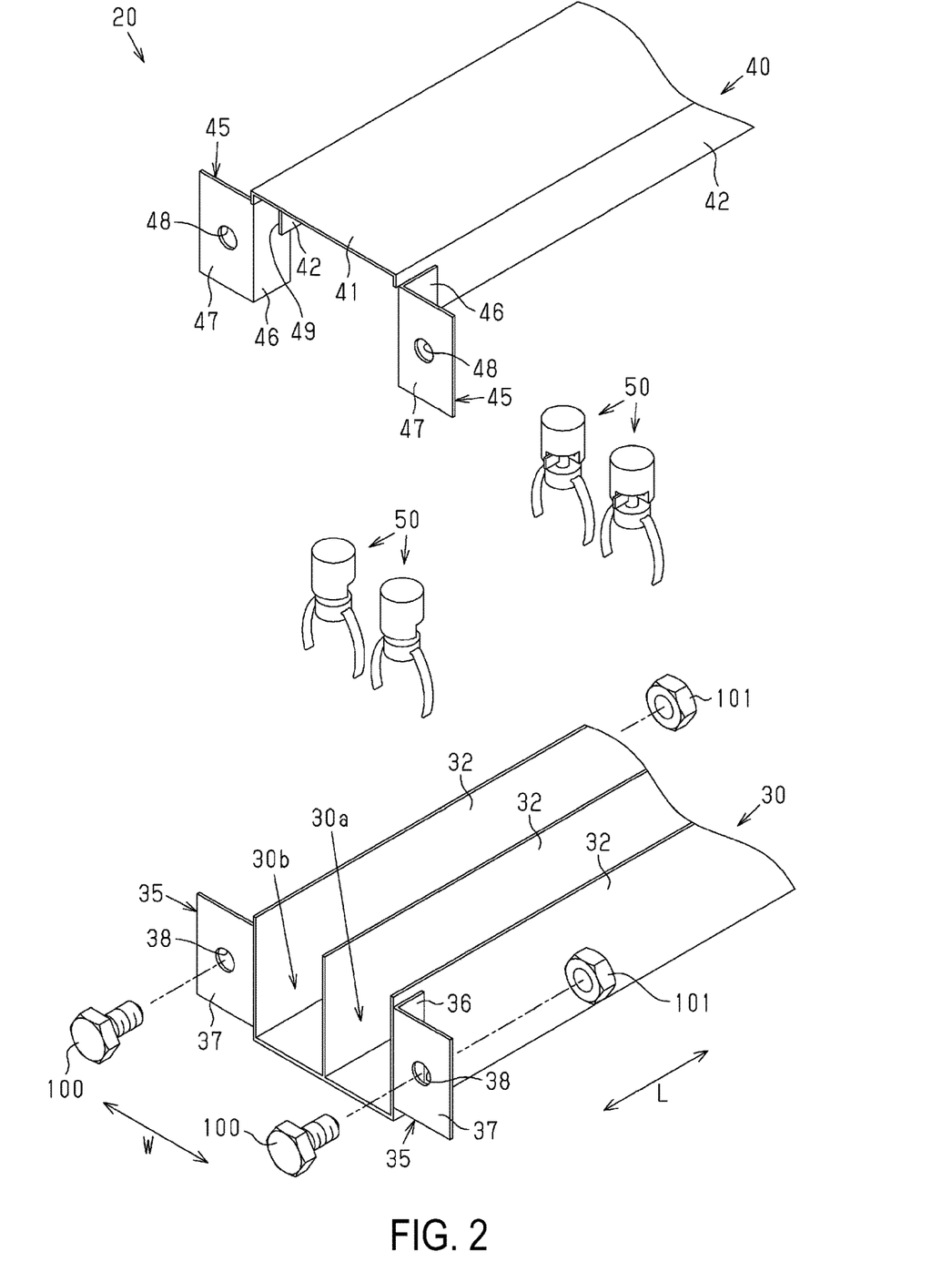
FIG. 2 is an exploded perspective view of the wire harness according to the embodiment.

As shown in FIGS. 1 and 2, the wire harness is provided with two electrical wires 10 arranged in parallel, and a conductive electromagnetic shield member 20 that covers the electrical wires 10.

Each electrical wire 10 includes a conductive core wire and an insulating coating that covers the outer circumferential surface of the core wire.

The electromagnetic shield member 20 is provided with a case 30 that has groove portions 30a and 30b (grooves) into which the electrical wires 10 are individually housed, a cover 40 that is attached to the case 30 and covers the groove portions 30a 30b, and a plurality of (four in the present embodiment) pressing mechanisms 50 that are provided on the cover 40 and press the electrical wires 10. The case 30 and the cover 40 are made of a metal material such as an aluminum alloy.

Note that, in the following, the direction in which the groove portions 30a and 30b extend is defined as an extending direction L, and the direction that is orthogonal to the extending direction L and is the direction in which the groove portions 30a and 30b are arranged in parallel is defined as a width direction W.

Case 30

As shown in FIG. 2, the case 30 has a bottom wall 31 that extends along the extending direction L and a plurality of side walls 32. As shown in the example in FIG. 2, the case 30 has three side walls 32 that respectively protrude from the two ends of the bottom wall 31 in the width direction W and a central portion in the width direction W. The side walls 32 each extend along the entirety of the bottom wall 31 in the extending direction L.

The groove portions 30a and 30b are each formed by the bottom wall 31 and a pair of side walls 32 that are adjacent in the width direction W. In the present embodiment, the groove portion 30a and the groove portion 30b share the side wall 32 located at the center portion in the width direction W.

The case 30 has a pair of L-shaped brackets 35 respectively joined to the outer faces of the side walls 32 at the two ends of the case 30 in the width direction W. Each bracket 35 has a joining portion 36 joined to one end in the extending direction L of the corresponding side wall 32, and an attachment portion 37 that is bent from the one end in the extending direction L of the joining portion 36. Each attachment portion 37 is provided with an attachment hole 38 that extends therethrough in the extending direction L. Note that each attachment portion 37 is flush with the one end in the extending direction L of the corresponding side wall 32.

Cover 40

As shown in FIG. 2, the cover 40 has an opposing wall 41 that extends along the extending direction L and opposes the bottom wall 31 of the case 30, and two side walls 42 that protrude from the two ends in the width direction W of the opposing wall 41. The side walls 42 each extend along the entirety of the opposing wall 41 in the extending direction L.

Figure 4:
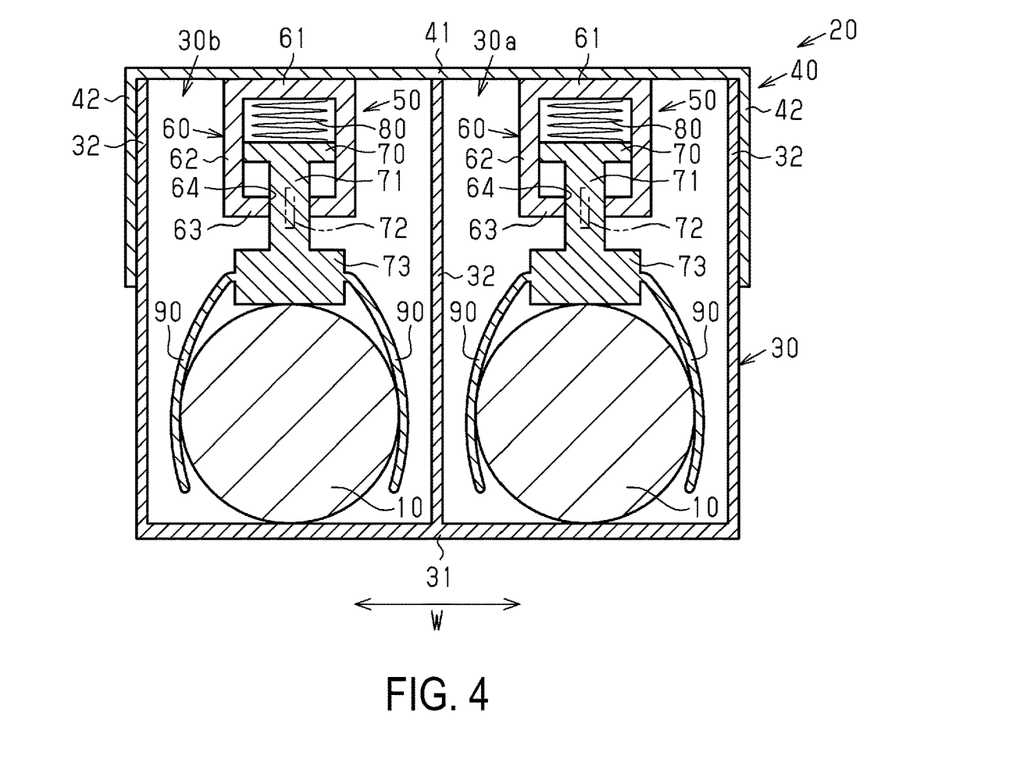
FIG. 4 is a cross-sectional view of the wire harness at a position corresponding to line 4-4 in FIG. 3.

As shown in FIGS. 1 and 4, the side walls 32 at the two ends of the case 30 in the width direction W are covered from the outer side in the width direction W by the side walls 42 of the cover 40.

As shown in FIG. 2, the cover 40 has a pair of L-shaped brackets 45 respectively joined to the outer faces of the side walls 42 at the two ends of the cover 40 in the width direction W. Each bracket 45 has a joining portion 46 joined to one end in the extending direction L of the corresponding side wall 42, and an attachment portion 47 that is bent from the one end in the extending direction L of the joining portion 46. Each attachment portion 47 is provided with an attachment hole 48 that extends therethrough in the extending direction L.

Here, escape portions 49 for preventing interference with the joining portions 36 of the bracket 35 of the case 30 when the cover 40 is attached to the case 30, are formed by cutting out portions at the one end in the extending direction L of the side walls 42. The joining portion 46 of each bracket 45 covers the corresponding escape portion 49 from the outer side in the width direction W.

By overlapping the brackets 35 of the case 30 and the brackets 45 of the cover 40 in the extending direction L, and screwing nuts 101 onto bolts 100 passed through the attachment holes 38 of the brackets 35 and the attachment holes 48 of the brackets 45, the cover 40 is fixed to the case 30.

Pressing Mechanism 50

Figure 3:
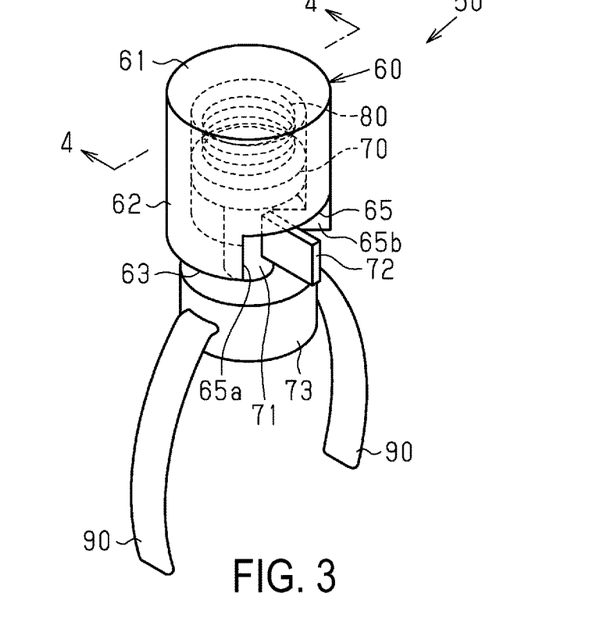
FIG. 3 is a perspective view of a pressing mechanism in a state where the position of a piston is between a first position and a second position.

As shown in FIGS. 3 and 4, the pressing mechanism 50 includes a cylinder 60 provided on the inner face of the opposing wall 41 of the cover 40, a disc-shaped piston 70 provided so as to be able to reciprocally move in the cylinder 60, and a column-shaped piston rod 71 that is coupled to the piston 70. The leading end portion of the piston rod 71 protrudes from one end (lower end in FIGS. 3 and 4) of the cylinder 60. A coil spring 80 serving as a biasing member that biases the piston 70 toward the above-described one end of the cylinder 60 is provided in the cylinder 60. Note that FIG. 3 shows the pressing mechanism 50 in a state where it is housed with the electrical wire 10 in the electromagnetic shield member 20, that is, a state where the coil spring 80 is elastically compressed.

The cylinder 60 has a cylindrical peripheral wall 62 and a top wall 61 and a bottom wall 63 respectively provided at the ends of the peripheral wall 62. The inner portion of the cylinder 60 is formed by the peripheral wall 62, the top wall 61, and the bottom wall 63, and is formed as a columnar housing space in which the piston 70 is housed. Note that the cylinder 60 is made of a resin material. Also, while omitted from the drawings, the cylinder 60 is formed by a pair of halved bodies that each have a semi cylindrical shape and engage with each other.

In the following, a circumferential direction centered around the axis of the cylinder 60 is simply referred to as a circumferential direction C.

The cylinder 60 is attached to the cover 40 by fitting the upper end portion of the cylinder 60, including the top wall 61, into a fitting hole (not shown) provided in the opposing wall 41 of the cover 40, for example.

The central portion of the bottom wall 63 of the cylinder 60 is provided with an insertion hole 64 into which the piston rod 71 is inserted.

The leading end portion of the piston rod 71 is provided with a columnar pressing portion 73 that has a larger diameter than the piston rod 71. In the present embodiment, the electrical wire 10 is pressed toward the bottom wall 31 of the case 30 by the pressing portion 73.

The pressing portion 73 of the piston rod 71 is provided with a pair of arm portions 90 (arms) serving as a grip portion that grips the electrical wire 10. The arm portions 90 are provided such that the distance between the two leading end portions thereof can be changed through elastic deformation.

The lower end portion of the cylinder 60 including the bottom wall 63 is provided with a cut-out portion 65 formed by cutting out a portion of both the peripheral wall 62 and the bottom wall 63. The outside and inside of the cylinder 60 are brought into communication with each other via the cut-out portion 65. The angle formed by an end surface 65*a* on one side in the circumferential direction C of the cut-out portion 65 and an end surface 65*b* on the other side in the circumferential direction C is 90°.

The outer diameter of the piston 70 is slightly smaller than the inner diameter of the cylinder 60. Also, the outer diameter of the piston rod 71 is slightly smaller than the diameter of the insertion hole 64 in the bottom wall 63 of the cylinder 60. The piston 70, the piston rod 71, the pressing portion 73, and the arm portions 90 are formed integrally using a resin material.

Based on the description above, the piston 70 is provided so as to be able to pivot in the circumferential direction C inside the cylinder 60.

A rectangular plate-shaped protruding ridge 72 is provided on the outer circumferential surface of the piston rod 71. The cross-sectional shape in the protruding direction of the protruding ridge 72 is a rectangle that is elongated in an up-down direction. The protruding ridge 72 is provided at a position of the piston rod 71 that corresponds to the cut-out portion 65 of the cylinder 60, and protrudes outward past the outer circumferential surface of the peripheral wall 62 of the cylinder 60.

Figure 5A:
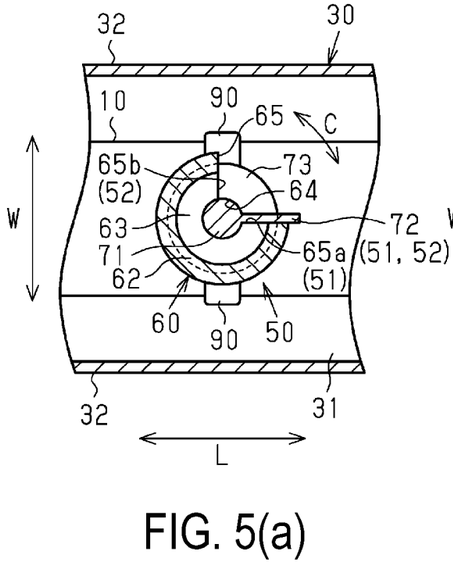
FIG. 5(a) is a cross-sectional view of a portion of the wire harness in a state where the piston is at the first position.

As shown in FIG. 5(*a*), as a result of the protruding ridge 72 abutting against the end surface 65*a* of the cut-out portion 65 from the one side in the circumferential direction C accompanying rotation of the piston 70, the piston 70 is kept from rotating to the other side in the circumferential direction C. Below, the position of the piston 70 in the circumferential direction C at this time is referred to as a "first position".

Figure 5B:
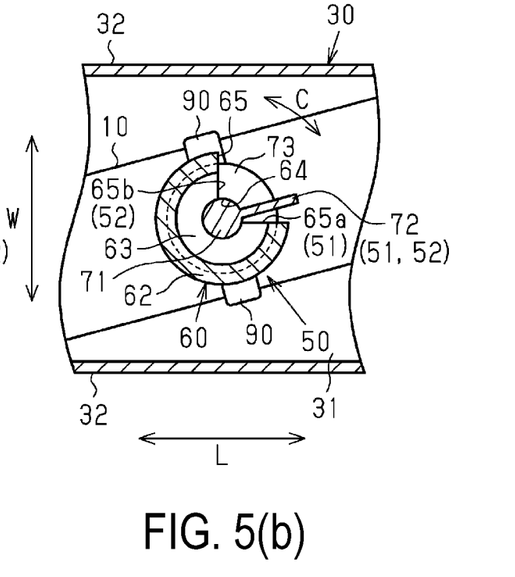
FIG. 5(b) is a cross-sectional view of a portion of the wire harness in a state where the piston is located between the first position and the second position.

As shown in FIG. 5(*b*), the piston 70 at the first position is allowed to rotate toward the one side in the circumferential direction C.

Similarly, as a result of the protruding ridge 72 abutting against the end surface 65*b* of the cut-out portion 65 from the other side in the circumferential direction C accompanying rotation of the piston 70, the piston 70 is kept from rotating to the one side in the circumferential direction C. Below, the position of the piston 70 in the circumferential direction C at this time is referred to as a "second position".

The piston 70 at the second position is allowed to rotate toward the other side in the circumferential direction C.

Based on the description above, the piston 70 is provided so as to be able to pivot between the first position and the second position, inside the cylinder 60.

In the present embodiment, the protruding ridge 72 of the piston rod 71 and the end surface 65*a* of the cut-out portion 65 of the cylinder 60 constitute a first restricting portion 51 (first protrusion) that restricts rotation of the piston 70 to the other side in the circumferential direction C. Similarly, the protruding ridge 72 of the piston rod 71 and the end surface 65*b* of the cut-out portion 65 of the cylinder 60 constitute a second restricting portion 52 (second protrusion) that restricts rotation of the piston 70 to the one side in the circumferential direction C.

Figure 6:
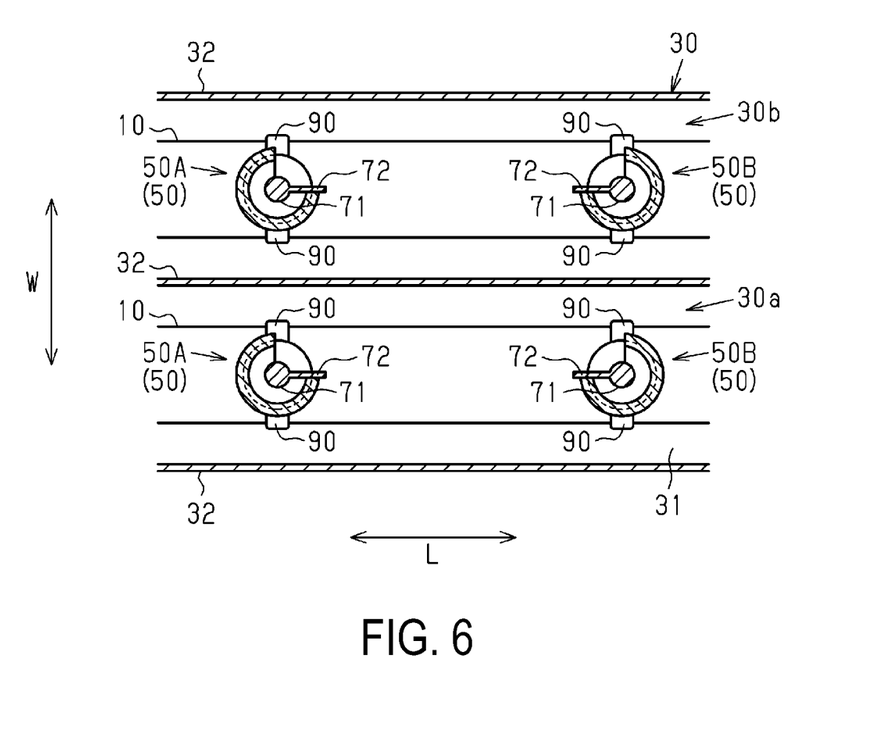
FIG. 6 is a cross-sectional view showing the wire harness in a state where electrical wires according to the embodiment are not curved.

As shown in FIG. 6, in the present embodiment, two pressing mechanisms 50 are arranged adjacent to each other in the extending direction L in each of the groove portions 30*a* and 30*b*. Of the two pressing mechanisms 50 in each of the groove portions 30*a* and 30*b*, the pressing mechanism 50 on one side in the extending direction L (left side in FIG. 6) is attached to the cover 40 so that the piston 70 is located at the first position, and the pressing mechanism 50 on the other side in the extending direction L (right side in FIG. 6) is attached to the cover 40 so that the piston 70 is located at the second position. Note that the leading end surfaces of the protruding ridges 72 of the piston rods 71 of the two pressing mechanisms 50 in each groove portion 30a and 30b oppose each other in the extending direction L.

Below, for ease of description, the pressing mechanism 50 attached to the cover 40 so that the position of the piston 70 is at the first position is referred to as a "pressing mechanism 50A", and the pressing mechanism 50 attached to the cover 40 so that the position of the piston 70 is at the second position is referred to as a "pressing mechanism 50B".

As described above, the pistons 70 of the pressing mechanisms 50A and 50B are allowed to rotate to the side that is opposite to the side to which rotation is restricted in the circumferential direction C. For this reason, the two pressing mechanisms 50A and 50B in each of the groove portions 30a and 30b are only allowed to rotate in opposite directions in the circumferential direction C.

Operations of the present embodiment will be described below.

As shown in FIG. 6, in a state where an electrical wire 10 is disposed extending along the extending direction L in each of the groove portions 30a and 30b, the positions of the pistons 70 of the pressing mechanism 50A and the pressing mechanism 50B are respectively the first position and the second position. The electrical wires 10 are pressed toward the bottom wall 31 of the case 30 by the pressing portions 73 of the pressing mechanisms 50A and 50B (referred to as "Operation 1" below).

The pressing portion 73 of each of the piston rods 71 is provided with the pair of arm portions 90 that grip the electrical wire 10. The piston 70, to which the piston 71 is coupled, is provided so as to be able to pivot in the circumferential direction C inside the cylinder 60. Thus, the portion of each electrical wire 10 sandwiched between a pair of arm portions 90 can pivot in the circumferential direction C. Accordingly, when excess length is generated in the electrical wires 10 due to thermal expansion, due to the pistons 70 pivoting, the electrical wires 10 can curve so as to bulge in the width direction W while remaining pressed against the bottom wall 31 of case 30 (referred to as "Operation 2" below).

Figure 7:
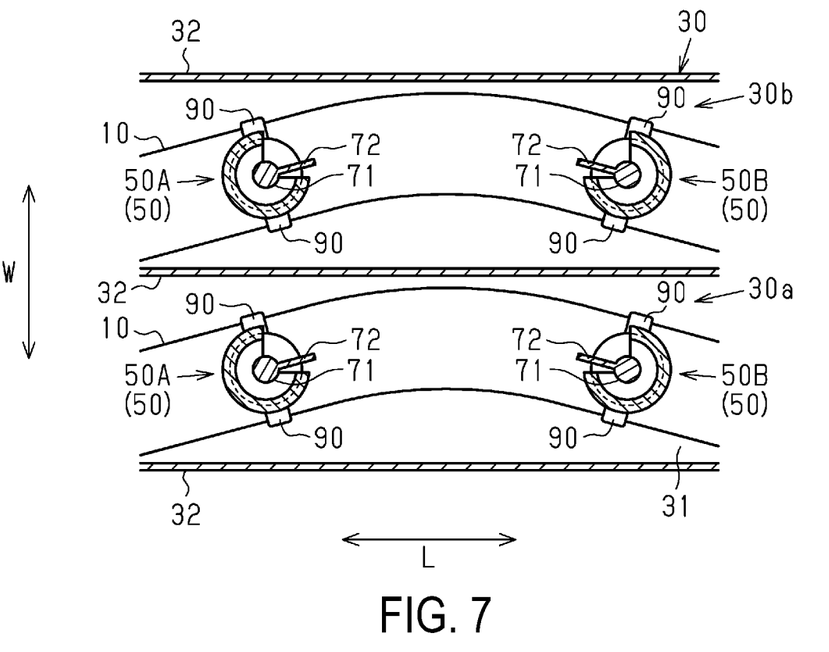
FIG. 7 is a cross-sectional view showing the wire harness in a state where the electrical wires according to the embodiment are curved.

For this reason, the two pressing mechanisms 50A and 50B are only allowed to rotate in opposite directions in the circumferential direction C. Thus, as shown in FIG. 7, the portion of each electrical wire 10 located between the corresponding pressing mechanisms 50A and 50B is unlikely to curve so as to bulge to the one side in the width direction W (lower side in FIG. 7), and is more likely to curve to the other side in the width direction W (upper side in FIG. 7) than toward the aforementioned one side (referred to as "Operation 3" below).

Effects of the present embodiment will be described below.

(1) An electromagnetic shield member 20 including: a case 30 that has groove portions 30a and 30b into which two electrical wires 10 are individually housed, respectively; a cover 40 that is attached to the case 30 and covers the groove portions 30a and 30b; and pressing mechanisms 50 that are provided on the cover 40, and press the electrical wires 10 toward a bottom wall 31 of the case 30. Each of the pressing mechanisms 50 includes: a cylinder 60 provided on an opposing wall 41 of the cover 40; a piston 70 provided so as to be capable of reciprocal movement in the cylinder 60; and a coil spring 80 provided in the cylinder 60 as a biasing member that biases the piston 70 toward one end of the cylinder 60. Also, each pressing mechanism 50 includes a piston rod 71 that is coupled to the piston 70, protrudes from the one end of the cylinder 60, and has a leading end portion that presses an electrical wire 10.

With this configuration, the above-described Operation 1 is realized, and thus floating of the electrical wires 10 from an inner surface of the electromagnetic shield member 20 can be suppressed.

Also, if a configuration is employed in which, for example, an electrical wire 10 is pressed against the bottom wall 31 or the like of the case 30 using a band member, there is a possibility that the band member will bite into the electrical wire 10 due to thermal expansion or vibration of the electrical wire 10.

In this respect, with the above configuration, displacement caused by thermal expansion or vibration of the electrical wire 10 is absorbed by the coil spring 80. Accordingly, the above-described issues can be kept from occurring.

(2) Each pressing mechanism 50 is provided with a pair of arm portions 90 that are provided at a leading end portion of the piston rod 71 and serve as a grip portion that grips the corresponding electrical wire 10, and the piston 70 is provided so as to be able to pivot in a circumferential direction C centered around the axis of the cylinder 60, inside the cylinder 60.

With this configuration, the above-described Operation 2 is realized, and thus even if excess length is generated in the electrical wire 10, floating of the electrical wire 10 can be suppressed.

(3) The electromagnetic shield member 20 is provided with a first restricting portion 51 and a second restricting portion 52 that respectively restrict rotation of the piston 70 to one side and another side in the circumferential direction C of the piston 70. Two pressing mechanisms 50 are provided spaced apart from each other in an extending direction L of each of the groove portions 30a and 30b of the case 30. Out of these two pressing mechanisms 50, one pressing mechanism 50 (50A) is attached to the cover 40 in a state where rotation of the corresponding piston 70 to the one side is restricted by the first restricting portion 51, and the other pressing mechanism 50 (50B) is attached to the cover 40 in a state where rotation of the corresponding piston 70 to the other side is restricted by the second restricting portion 52.

With this configuration, the above-described Operation 3 can be realized.

Here, in the case where, for example, a heat source or the like is present on one side in the width direction W of the electromagnetic shield member 20, curving of the electrical wires 10 in the groove portions 30a and 30b toward the above-mentioned one side is not favorable as heat is more likely to be generated in the electrical wires 10.

Thus, if the two above-described pressing mechanisms 50 are arranged such that the portion of the corresponding electrical wire 10 located between the pressing mechanisms 50 is made less likely to curve toward the above-described one side, the electrical wires 10 in the groove portions 30a and 30b can be kept from curving toward the heat source.

(4) A pair of arm portions 90 are provided so that the distance between leading end portions thereof can be changed.

With this configuration, the distance between the leading end portions of the pair of arm portions 90 can be changed, and thus various types of electrical wires of varying sizes can be gripped.

(5) A wire harness is provided with two electrical wires 10 and the electromagnetic shield member 20. The pressing mechanisms 50 are provided on the cover 40, and press the electrical wires 10 toward the bottom wall 31 of the case 30.

With this configuration, effects according to the above-described Effects (1) to (4) can be realized.

The following changes can be made to the present embodiment. The present embodiment and the following variations can be combined and implemented as long as there no technical contradiction.

Figure 8:
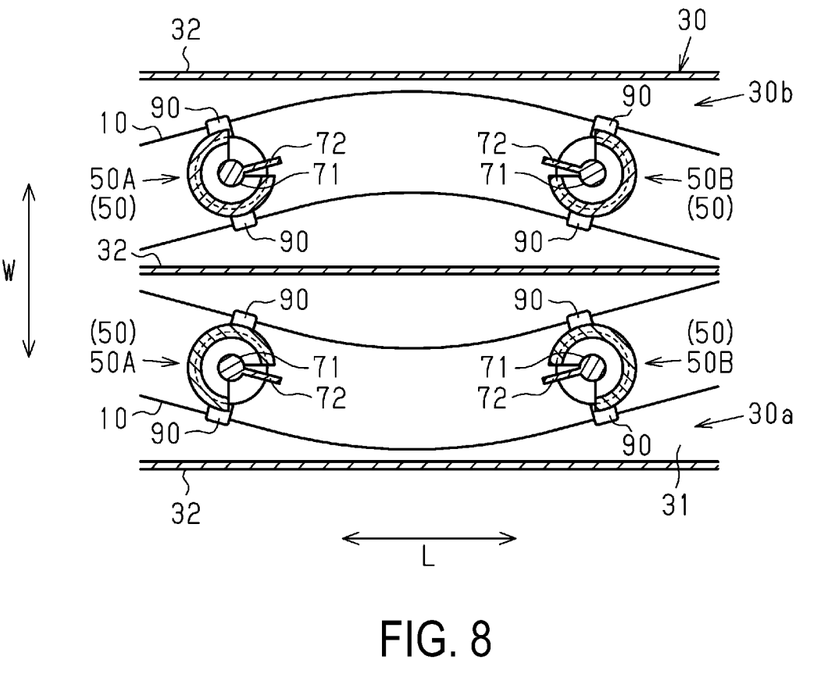
FIG. 8 is a cross-sectional view of a wire harness according to a first variation.

In the present embodiment, the pressing mechanism 50A and the pressing mechanism 50B are arranged in this order from the one side in the extending direction L, in each of the groove portions 30a and 30b, but as shown in FIG. 8, the pressing mechanism 50A and the pressing mechanism 50B may be arranged in this order from the other side of the extending direction L in the one groove portion 30a (the groove portion 30a on the lower side in FIG. 8), for example. In this case, the directions in which the electrical wires 10 in the groove portions 30a and 30b are likely to curve in the width direction W are opposite directions. Accordingly, a portion of one electrical wire 10 between the pressing mechanism 50A and the pressing mechanism 50B can be kept from approaching the corresponding portion of the adjacent electrical wire 10, in the width direction W. Thus, heat can be kept from accumulating in the electromagnetic shield member 20 due to the electrical wires 10 approaching each other.

The present disclosure can also be applied to a wire harness that has one electrical wire 10 or three or more electrical wires 10.

The pair of arm portions 90 may be biased by a biasing member such as a spring so that the leading end portions thereof approach each other. In this case, the distance between the leading end portions of the arm portion 90 can be changed by separating the leading end portions against the biasing force of the above biasing member.

The pair of arm portions 90 may be provided such that the distance between the leading end portions thereof cannot be changed.

In each of the pressing mechanisms 30a and 30b, only one pressing mechanism 50 can also be provided in the extending direction L, and three or more pressing mechanisms 50 can also be provided.

The cut-out portion 65 may also be formed by only cutting out a portion of the bottom wall 63 of the cylinder 60, and may also be formed by only cutting out a portion of the peripheral wall 62.

In a state where each electrical wire 10 is curved in advance to the one side or the other side in the width direction W, the pressing mechanisms 50A and 50B may be arranged in the groove portions 30a and 30b such that this state is maintained.

Each of the pressing mechanisms 50A and 50B can be arranged rotated 180° in the circumferential direction C so that the directions in which the protruding ridges 72 protrude are the opposite of those in the present embodiment.

Figure 9A:
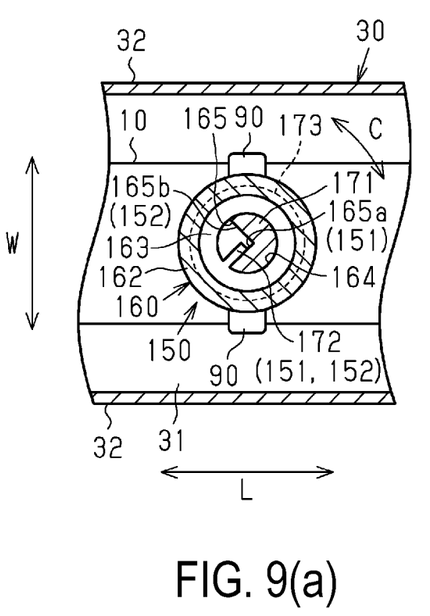
FIG. 9(a) is a cross-sectional view showing a state where a piston is located at a first position.
Figure 9B:
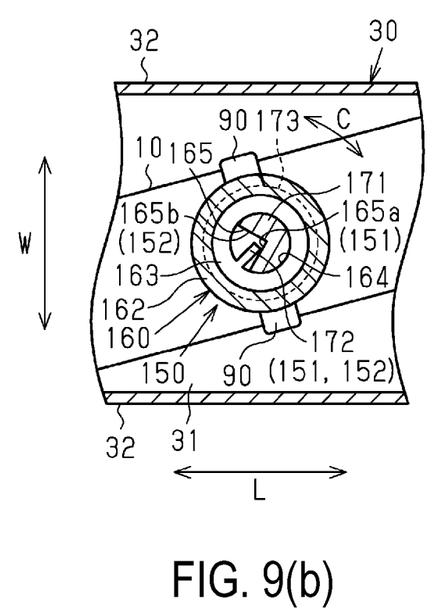
FIG. 9(b) is a cross-sectional view showing a state where the piston is located between the first position and a second position.

As illustrated with the second variation shown in FIGS. 9(a) and 9(b), the first restricting portion 51 (second restricting portion 52) is not limited to being constituted by the protruding ridge 72 of the piston rod 71 and the end surface 65a (end surface 65b) of the cut-out portion 65 of the cylinder 60. As another example, a first restricting portion 151 (second restricting portion 152) may be constituted by a protruding ridge 172 provided on an inner circumferential surface of a through-hole 164 in a bottom wall 163 of a cylinder 160 and a cut-out portion 165 formed in the outer circumferential surface of a piston rod 171. In this case as well, an effect according to the above-described Effect (3) can be realized. Note that configurations in the second variation that are the same as those of the above-described embodiment are given the same reference numerals, and corresponding configurations are given reference numerals to which 100 has been added to omit redundant description.

The first restricting portion 51 and the second restricting portion 52 can be omitted. In this case as well, an effect according to the above-described Effect (2) can be realized.

A semi-cylindrical grip portion can be provided at the leading end portion of the piston rod 71 instead of the pair of arm portions 90. In this case as well, the piston rod 71 can press the electrical wire 10 via the above-described grip portion.

The above-described grip portion can also be omitted. In this case as well, an effect according to the above-described Effect (1) can be realized.

The pressing portion 73 can also be omitted. In this case, the leading end portion of the piston rod 71 may directly press the electrical wire 10.

The piston 70 may also be provided so as to be unable to pivot in the circumferential direction C inside the cylinder 60.

Each of the pressing mechanisms 50 may be provided on the bottom wall 31 of the case 30. In this case, each electrical wire 10 is pressed toward the opposing wall 41 of the cover 40.

The electromagnetic shield member 20 is not limited to being made of an aluminum alloy. As another example, the electromagnetic shield member 20 may be made of stainless steel or the like.

The cross-sectional shape of a plane of the electrical wire 10 orthogonal to the extending direction L may be any cross-sectional shape such as a semi-circle or a polygonal shape.

The present disclosure encompasses the following implementation examples. The reference numerals of the representative components in the representative embodiment are provided not for limitation but for assistance in understanding.

[Supplementary Note 1]

One or more implementation examples of this disclosure is directed to an electromagnetic shield member (20) configured to electromagnetically shield an electrical wire (10), the electromagnetic shield member (20) including:

a housing chamber (30a) that has a first length and is configured to house a predetermined length portion of the electrical wire (10), the housing chamber (30a) having a bottom surface that has the first length and is configured to support the predetermined length portion of the electrical wire (10) from below, and a ceiling surface that opposes the bottom surface; and an elastic pressing mechanism (50) that is arranged on the ceiling surface of the housing chamber (30a) and elastically presses the electrical wire (10) toward the bottom surface so as to prevent floating of the predetermined length portion of the electrical wire (10) from the bottom surface.

[Supplementary Note 2]

In one or more implementation examples of this disclosure, the elastic pressing mechanism (50) can include a pivoting element (73, 90) that pivots in a predetermined pivotable direction accompanying extension of the predetermined length portion of the electrical wire (10).

[Supplementary Note 3]

In one or more implementation examples of this disclosure, the elastic pressing mechanism (50) including the pivoting element (73, 90) can be configured such that the predetermined length portion of the electrical wire (10) is allowed to undergo in-plane deformation on the bottom surface, and the predetermined length portion of the electrical wire (10) is prohibited from undergoing out-of-plane deformation relative to the bottom surface.

[Supplementary Note 4]

In one or more implementation examples of this disclosure, the elastic pressing mechanism (50) including the pivoting element (73, 90) can be configured such that when the predetermined length portion of the electrical wire (10) extends, due to thermal extension of the electrical wire (10), to a second length longer than the first length, the entire length of the predetermined length portion of the electrical wire (10) that has the second length is constantly in contact with the bottom surface.

[Supplementary Note 5]

In one or more implementation examples of this disclosure, the predetermined pivotable direction of the pivoting element (73, 90) can be determined such that the predetermined length portion of the electrical wire (10) undergoes in-plane curving on the bottom surface.

[Supplementary Note 6]

In one or more implementation examples of this disclosure, the pivoting element (73, 90) can have a pivotable degree range.

[Supplementary Note 7]

In one or more implementation examples of this disclosure, the predetermined length portion of the electrical wire (10) housed in the housing chamber (30a) can have a first position and a second position that is spaced apart from the first position in a longitudinal direction of the electrical wire (10), there are a plurality of the elastic pressing mechanisms (50) that respectively elastically press the electrical wire (10) at the first position and the second position of the electrical wire (10), and there are a plurality of pivoting elements (73, 90) that respectively correspond to the first position and the second position of the electrical wire (10).

[Supplementary Note 8]

In one or more implementation examples of this disclosure, the plurality of pivoting elements (73, 90) can be configured such that they independently limit an in-plane curving direction of the electrical wire (10) at the first position and an in-plane curving direction of the electrical wire (10) at the second position.

[Supplementary Note 9]

In one or more implementation examples of this disclosure, the housing chamber (30a) can be formed by a groove (31, 32) that has an opening end for drawing out the electrical wire (10) in the longitudinal direction (L), and a metal cover (40) configured to cover the groove (31, 32) and not cover the opening end, and the groove (31, 32) can be configured such that the predetermined length portion of the electrical wire (10) can be inserted into the groove (31, 32) from a radial direction or a lateral direction of the electrical wire (10).

[Supplementary Note 10]

In one or more implementation examples of this disclosure, the electrical wire (10) can have a first cross-sectional shape (a circular shape, for example), and the housing chamber (30a) can have a second cross-sectional shape (a rectangle, for example) that is different from the first cross-sectional shape.

[Supplementary Note 11]

In one or more implementation examples of this disclosure, the electrical wire (10) can be a power line.

[Supplementary Note 12]

In one or more implementation examples of this disclosure, the housing chamber (30a) can be one of a plurality of housing chambers (30a, 30b) configured to respectively house a plurality of the electrical wires (10).

It will be apparent to those skilled in the art that the present disclosure may be embodied in other specific forms without departing from the technical concept of the present disclosure. Some of the components described in the embodiment (or one or more aspects thereof) may be omitted, or some of the components may be combined, for example. The scope of the present disclosure is intended to be determined with reference to the appended claims, along with the full scope of equivalents to which such claims are entitled.

The invention claimed is:

1. An electromagnetic shield member comprising:
   a case that includes a groove in which an electrical wire is to be individually housed;
   a cover configured to be attached to the case and cover the groove; and
   a pressing mechanism that is provided on one of the case and the cover, and is configured to press the electrical wire toward other of the case and the cover,
   wherein the pressing mechanism includes:
      a cylinder provided on one of a bottom wall of the groove and an opposing wall of the cover opposing the bottom wall of the groove;
      a piston provided so as to be capable of reciprocal movement in the cylinder;
      a spring that is provided in the cylinder, and is configured to bias the piston toward one end of the cylinder; and
      a piston rod that is coupled to the piston, protrudes from the one end of the cylinder, and has a leading end configured to press the electrical wire.

2. The electromagnetic shield member according to claim 1, wherein:
   the pressing mechanism includes a grip that is provided at the leading end of the piston rod and is configured to grip the electrical wire, and
   the piston is configured to pivot in a circumferential direction centered around an axis of the cylinder, inside the cylinder.

3. The electromagnetic shield member according to claim 2, further comprising:
   a first protrusion and a second protrusion configured to respectively restrict rotation of the piston to one side and another side in the circumferential direction of the piston, wherein:
      the groove includes a plurality of grooves and the pressing mechanism includes a plurality of pressing mechanisms that are provided spaced apart from each other in an extending direction of the plurality of grooves of the case, and
      a first pressing mechanism out of two of the plurality of pressing mechanisms that are adjacent in the extending direction is provided in a state where rotation of the piston thereof to the one side is restricted by the first protrusion, and a second pressing mechanism out of the two of the plurality of pressing mechanisms is provided in a state where rotation of the piston thereof to the another side is restricted by the second protrusion.

4. The electromagnetic shield member according to claim 2, wherein:
   wherein the grip is provided with a pair of arms, and
   the pair of arms are provided such that a distance between leading ends of the par of arms can be changed.

5. A wire harness comprising:
   the electrical wire; and
   the electromagnetic shield member according to claim 1, wherein the pressing mechanism is provided on one of the case and the cover, and presses the electrical wire toward other of the case and the cover.

\* \* \* \* \*